United States Patent
Rodgers et al.

(12)

(10) Patent No.: US 6,185,126 B1
(45) Date of Patent: *Feb. 6, 2001

(54) SELF-INITIALIZING RAM-BASED PROGRAMMABLE DEVICE

(75) Inventors: T. J. Rodgers, Woodside; W. Alfred Graf, III, Saratoga, both of CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/805,890

(22) Filed: Mar. 3, 1997

(51) Int. Cl.[7] .................................................. G11C 11/00
(52) U.S. Cl. ...................... 365/154; 365/156; 365/189.02
(58) Field of Search .................................. 365/154, 156, 365/189.02, 230.02

(56) References Cited

U.S. PATENT DOCUMENTS

| 3,798,621 | 3/1974 | Baitinger et al. ................. 340/173 R |
|---|---|---|
| 4,149,268 | 4/1979 | Waters ..................................... 365/95 |
| 4,418,401 | 11/1983 | Bansal ..................................... 365/95 |
| 4,821,233 | 4/1989 | Hsieh ..................................... 365/203 |
| 5,148,390 | 9/1992 | Hsieh ..................................... 365/95 |
| 5,230,058 | 7/1993 | Kumar et al. ......................... 395/800 |
| 5,648,930 | * 7/1997 | Randazzo .............................. 365/154 |
| 5,659,498 | * 8/1997 | Pascucci et al. ...................... 365/154 |

* cited by examiner

*Primary Examiner*—Son T. Dinh
(74) *Attorney, Agent, or Firm*—Wagner, Murabito & Hao LLP

(57) ABSTRACT

A programmable logic device includes a node and a RAM cell configured to power-up in a preferred state so as to provide a predetermined logic signal to the node upon power-up. The node may comprise an interconnection element, for example a transistor. Associated with the interconnection element may be two signal lines within the programmable logic device, for example, as part of a programmable interconnect matrix. The interconnection element and the two signal lines are associated such that when the interconnection element is in a first state the two signal lines are electrically coupled and when the interconnection element is in a second state the two signal lines are not electrically coupled. The predetermined logic signal from the RAM cell selects one of the first and second states. The RAM cell may include two PMOS transistors, each having an associated threshold voltage, wherein the threshold voltage of one of the PMOS transistors is lower than the threshold voltage of the other PMOS transistor. The RAM cell may be included in a look-up table such that the node is an output of the look-up table. Alternatively, the programmable logic device may further include a multiplexer wherein the RAM cell is coupled to the data path input of the multiplexer through the node. In other embodiments, the RAM cell may act as a select cell for the multiplexer.

15 Claims, 5 Drawing Sheets

SELF-INITIALIZING RAM-BASED PROGRAMMABLE DEVICE

FIELD OF THE INVENTION

The present invention relates to programmable logic devices and, more particularly, to programmable logic devices employing volatile programmable cells for use in configuring desired logic functions.

BACKGROUND

Programmable logic devices (PLDs) are popular general purpose logic devices. Traditional PLDs generally include a number of logic elements (e.g., in the form of logic cells or a logic array) and a number of input/output (I/O) macrocells. A routing interconnect is used to transport electrical signals from input macrocells to selected logic elements. The logic elements typically provide a number of logical AND and logical OR functions which are combined to create a number of output signals, called sum of product expressions. The signals generated by the logic elements are then passed to macrocells which typically include register elements. The macrocells are coupled to output pads for transferring the logic signals out of the PLD and also may also be coupled to signal paths which feed back the logic signals to further logic elements to create even more complex logic signals.

These programmable logic devices are capable of implementing various logic functions by selectively coupling the electrical signals within the device to desired logic elements (e.g., AND gates, OR gates, etc.). Selected logic paths for the electrical signals can be implemented by programming appropriate elements in the routing interconnect. Typically, these programmable elements are non-volatile, that is, once programmed the elements retain their respective programmed states even when power is removed from the device.

Some families of programmable logic devices such as PLDs, complex PLDs (so-called CPLDs) and field programmable gate arrays (FPGAs) have replaced traditional programmable elements (e.g., fuses, antifuses, EPROM cells, EEPROM cells and flash cells) with volatile, i.e., RAM (random access memory), elements. So-called RAM-based FPGAs (and other RAM-based programmable logic devices) implement logic gates and/or programmable interconnect points with volatile RAM cells which lose their programmed (or stored) state when power is turned off. As a result, RAM-based FPGAs must be programmed after power-up with the appropriate stored states for each RAM cell to configure the desired logic functions. These stored states are typically loaded via a serial interface from a non-volatile storage source such as a companion EPROM or EEPROM device which maintains its stored contents when the power supply is removed. Alternatively, RAM-based FPGAs may be configured by loading the stored states for the desired logic function from a magnetic disc source via a microcontroller or by another means.

Regardless of the method used to program the RAM cells of the FPGA, there is a delay after power-up before the logic can be utilized by other elements in the system in which the device operates. Consequently, RAM-based FPGAs cannot be used to implement those portions of a system which control initialization upon power-up. Further, the non-volatile storage devices used to store the configuration program for such RAM-based FPGAs require additional system overhead (including space on a printed circuit board in those systems so designed).

Accordingly, what is needed is a means for setting the power-up state of some or all of the storage elements in such a RAM-based FPGA or other programmable device to ensure that the proper stored state will be available immediately upon power up. In addition, it is also desirable to eliminate the need for a separate non-volatile storage device for programming such RAM-based programmable devices.

SUMMARY OF THE INVENTION

In one embodiment, the present invention provides a programmable logic device which includes a node and a RAM cell configured to power-up in a preferred state so as to provide a predetermined logic signal to the node upon power-up.

The node may comprise an interconnection element, for example a transistor. Associated with the interconnection element may be two signal lines within the programmable logic device, for example, as part of a programmable interconnect matrix. The interconnection element and the two signal lines are associated such that when the interconnection element is in a first state the two signal lines are electrically coupled and when the interconnection element is in a second state the two signal lines are not electrically coupled. The predetermined logic signal from the RAM cell selects one of the first and second states.

In another embodiment, the RAM cell may include two PMOS transistors, each having an associated threshold voltage, wherein the threshold voltage of one of the PMOS transistors is lower than the threshold voltage of the other PMOS transistor. The RAM cell may be included in a look-up table such that the node is an output of the look-up table.

In yet another embodiment, the programmable logic device may further include a multiplexer wherein the RAM cell is coupled to the multiplexer through the node.

In a further embodiment, the present invention provides a method of programming a programmable logic device by applying power to the device and powering up a RAM cell in a preferred state so as to provide a predetermined logic signal to a node within the device.

These and other features and advantages of the present invention will be apparent to those skilled in the art upon review of the detailed description below and the figures referenced therein.

BRIEF DESCRIPTION OF THE DRAWINGS

The features and advantages of the present invention are illustrated by way of example in the accompanying drawings which are in no way intended to limit the scope of the present invention to the particular embodiments shown.

DETAILED DESCRIPTION

Described herein is a programmable logic device which includes a RAM cell configured to power-up in a preferred state so as to provide a predetermined logic signal to a node upon power-up. The RAM cell may include two PMOS transistors, each having an associated threshold voltage, wherein the threshold voltage of one of the PMOS transistors is lower than the threshold voltage of the other PMOS transistor.

In one embodiment, the RAM cell may be coupled to an interconnection element, for example a transistor. Associated with the interconnection element may be two signal lines within the programmable logic device, for example, as part of a programmable interconnect matrix. The interconnection element and the two signal lines are associated such that when the interconnection element is in a first state the two signal lines are electrically coupled and when the interconnection element is in a second state the two signal lines are not electrically coupled. The predetermined logic signal from the RAM cell selects one of the first and second states.

In another embodiment, the RAM cell may be included in a look-up table such that the node is an output of the look-up table. Alternatively, the programmable logic device may further include a multiplexer wherein the RAM cell is coupled to the multiplexer through the node.

Although described with reference to an FPGA architecture, those skilled in the art will recognize that the present invention is equally applicable for use in PLDs, CPLDs, ASICs or other programmable devices. Accordingly, the embodiments described below should be regarded as illustrative only.

Figure 1:
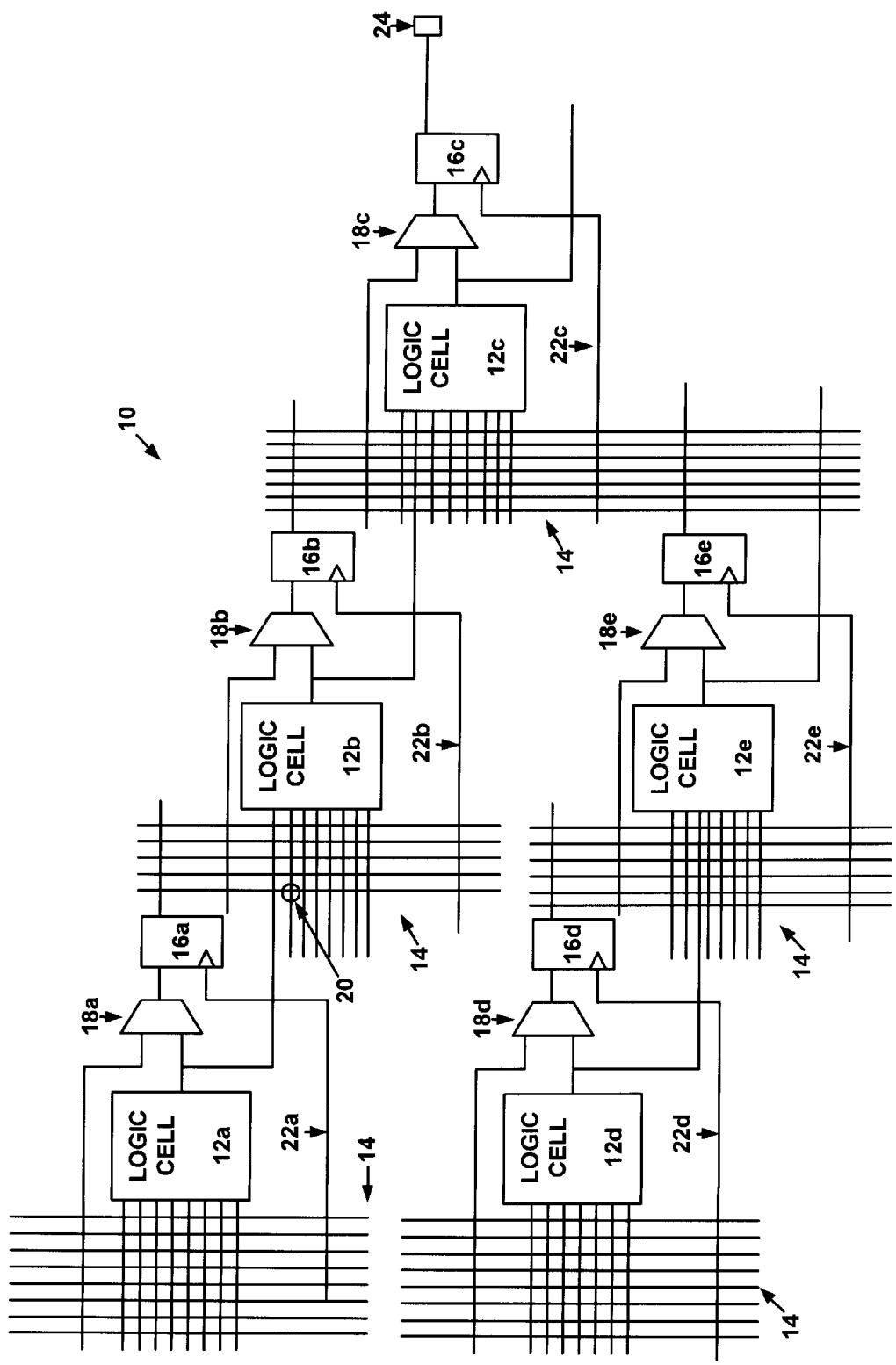
FIG. 1 illustrates a field programmable gate array (FPGA) configured in accordance with the present invention.

FIG. 1 illustrates a portion of a field programmable gate array (FPGA) configured in accordance with the present invention. FPGA 10 includes a number of logic cells 12*a*–12*e*, a programmable interconnect matrix 14, register elements 16*a*–16*e* and multiplexers 18*a*–18*e*. Logic signals within the FPGA 10 may be routed from an output of one logic cell, e.g., logic cell 12*a*, to the input of a subsequent logic cell, e.g., logic cell 12*b*, through the programmable interconnect matrix 14. The logic cells 12*a*–12*e* may be configured to provide various desired logic functions such as AND operations, OR operations, exclusive OR operations, etc.

Logic cells 12*a*–12*e* within FPGA 10 may receive and operate on one or more logic signals provided from programmable interconnect matrix 14. As illustrated, each logic cell 12*a*–12*e* has a number of input paths from programmable interconnect matrix 14. The interconnections of the inputs of the logic cells 12*a*–12*e* with other signal lines within programmable interconnect matrix 14 occur at interconnection points 20 where programmable elements are located. The programmable elements are programmed so as to electrically couple the respective signal lines within programmable interconnect matrix to provide desired input signals to each logic cell 12*a*–12*e*. While some traditional FPGAs utilize non-volatile programmable elements (e.g., fuses, antifuses, flash cells, etc.) at these interconnection points 20, FPGA 10 may utilize random access memory (RAM) cells at some or all of these locations. Hence, FPGA 10 is referred to as a RAM-based FPGA.

Logic cells 12*a*–12*e* may perform one or more logical operations on their respective input signals and provide output signals to programmable interconnect matrix 14 and/or register elements 16*a*–16*e*. Register elements 16*a*–16*e* capture data present on their respective input lines in response to clock signals provided on clock lines 22*a*–22*e*. As shown, the clock lines 22*a*–22*e* may themselves be coupled to other signal lines within programmable interconnect matrix 14. Alternatively, some or all of the clock lines 22*a*–22*e* may be dedicated clock signal paths.

In addition to receiving inputs from logic cells 12*a*–12*e*, register elements 16*a*–16*e* may receive signals directly from programmable interconnect matrix 14. Multiplexers 18*a*–18*e*, in response to appropriate control signals, route the desired input signals from either logic cells 12*a*–12*e* or programmable interconnect matrix 14 to the register elements 16*a*–16*e*.

As indicated, output signals from one logic cell 12*a*–12*e* may be one of several input signals to a subsequent logic cell 12*a*–12*e* which may then perform further logical operations to produce a further output signal. Ultimately, an output signal may be provided to an output pad 24.

Figure 2:
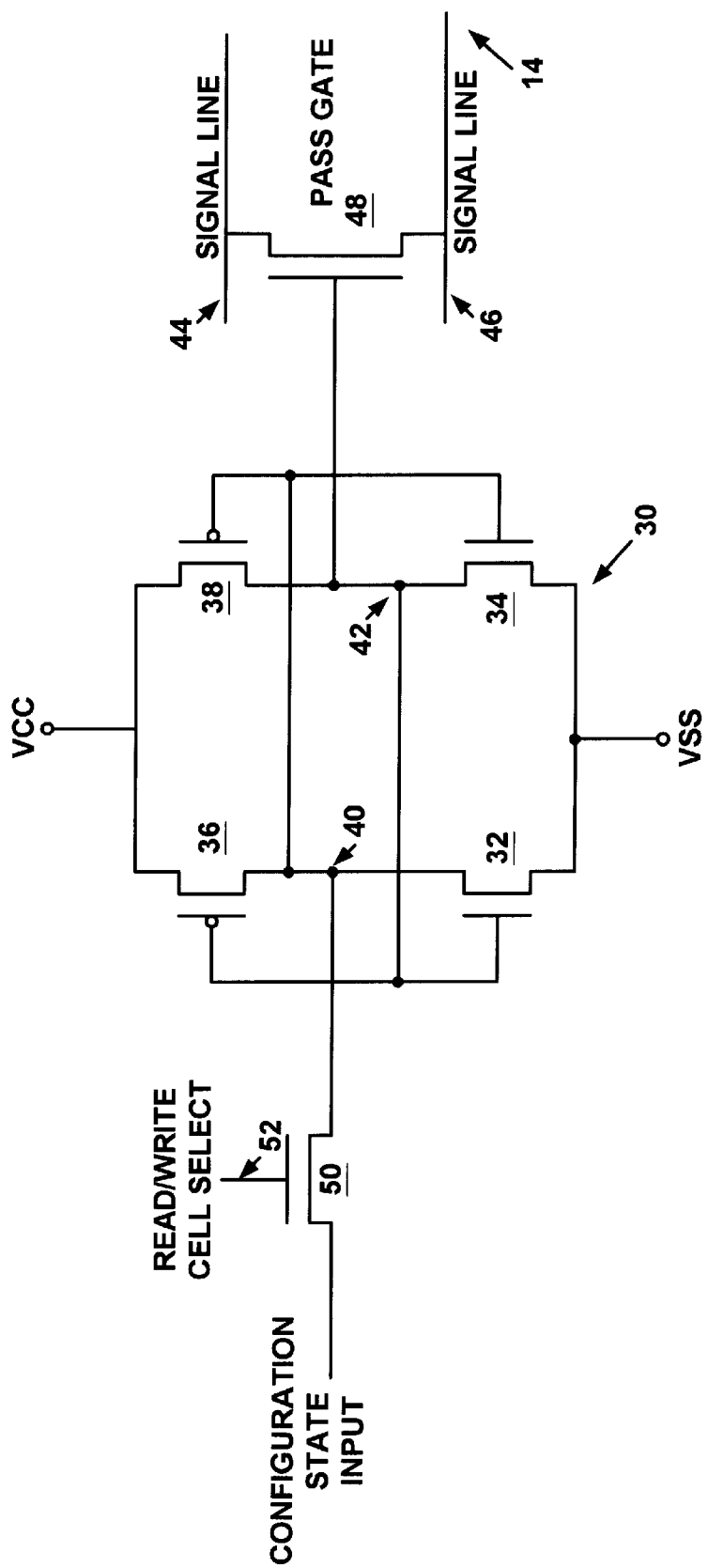
FIG. 2 illustrates a random access memory (RAM) cell configured to power-up in a preferred state according to the present invention.

FIG. 2 illustrates a RAM cell 30 which may be used at an interconnection point 20 within programmable interconnect matrix 14. For one embodiment, RAM cell 30 is a static random access memory (SRAM) cell implemented using metal oxide semiconductor (MOS) technology. FPGA 10 may include an array of such cells.

RAM cell 30 acts as a latch device for storing a single bit of data and is formed by a pair of cross-coupled CMOS inverters defined by NMOS transistors 32 and 34 and PMOS transistors 36 and 38. In an alternative embodiment, resistive load devices may be used instead of the PMOS transistors 36 and 38 of FIG. 2.

RAM cell 30 includes a first port 40 and a second port 42. The state of RAM cell 30 (i.e., programmed or not programmed) is determined by the respective voltages of the ports 40 and 42. That is, in one state, the first port 40 will be a logic HIGH while the second port 42 will be a logic LOW. Alternatively, when the RAM cell 30 is in a second state the first port 40 will be a logic LOW while the second port 42 will be a logic HIGH. Both the first port 40 and the second port 42 utilize the same logic basis for storage of these voltage levels in order to ensure that the first port 40 and the second port 42 can share the RAM cell 30. In other words, the first and second ports 40 and 42 must both use either a positive or a negative logic system. Hereafter, it will be assumed that RAM cell 30 uses a positive logic system with respect to the first port 40. This means that a logic HIGH level or "1" is represented by a voltage greater in magnitude than the voltage representing a logic LOW level or "0." For purposes of this description, the voltage level at the second port 42 will indicate the state of the RAM cell 30.

RAM cell 30 is used to control the interconnection of signal lines 44 and 46 within programmable interconnect matrix 14. Signal line 44 and signal line 46 are connected by an n-channel enhancement mode pass gate transistor 48 which when turned on electrically couples signal lines 44 and 46. Transistor 48 will he turned on when the RAM cell 30 is in the programmed state, i.e., when the RAM cell 30 stores a logic "1". This occurs when the voltage at the second port 42 is a logic HIGH and the voltage at the first port 40 is a logic LOW. When a logic "0" is stored in the RAM cell 30, the pass gate transistor 48 is turned off, thereby electrically disconnecting the two signal lines 44 and 46. In this way, Ram cells such as RAM cell 30 can be used to control the interconnection of some or all of the signal lines within programmable interconnect matrix 14.

Typical RAM-based FPGAs utilize similar schemes to control the interconnection of signal lines in a programmable interconnect matrix. However, because RAM cells are volatile storage devices, the state of the RAM cell (and hence the interconnection of the signal lines) is lost whenever power is removed from the device. Upon power-up, individual RAM cells within the programmable interconnect matrix of such FPGAs must be programmed by reading a configuration state from an associated non-volatile storage device as described above. This programming step is required because when a typical RAM cell is first powered-up, the cell will settle in one of its two possible states (i.e., programmed or not programmed). The state in which the cell will settled is determined by the symmetry of the cell and any voltage transients which may cause charge imbalances during power-up. Because the power-up process is uncertain, each cell must be programmed so that the desired interconnections are achieved.

Unlike a typical RAM cell, however, RAM cell 30 is configured to always power-up in a preferred state. That is, upon power-up, the voltage at the second port 42 will always settle into a predetermined logic state (HIGH or LOW). Thus, the state of the RAM cell 30 upon power-up is known and, hence, the interconnection (or lack thereof) of signal lines 44 and 46 is predictable. No separate programming step will be required, thus eliminating the need for a separate non-volatile storage device to retain a configuration state program.

RAM cell 30 can be configured to always power-up in a preferred state by adjusting the characteristics of the p-channel enhancement mode load transistors 36 and 38. The threshold voltage of load transistor 38 can be lowered by selectively implanting Boron in the channel region of load transistor 38 during fabrication. This may be accomplished using traditional fabrication methods such as masking an appropriate channel region of a semiconductor substrate by patterning a photoresist layer and implanting the Boron dopant either in a high temperature gas environment or using an ion beam accelerator.

When a RAM cell 30 in which only the threshold voltage of load transistor 38 has been so modified is powered-up, load transistor 38 will turn on (i.e., conduct) at a lower threshold voltage (relative to Vcc) than will load transistor 36. This, in turn, will cause the second port 42 to rise in voltage level faster than the first port 40 during the power-up sequence. As second port 42 rises faster relative to first port 41, n-channel enhancement mode transistor 32 will turn on, pulling the first port 40 lower and thereby increasing the drive on the gate of load transistor 38 while simultaneously turning off n-channel transistor 34. The net result is a RAM cell 30 which will predictably power-up in a "programmed" state, i.e., where the voltage at the second port 42 is a logic "1" while the voltage at the first port 40 is a logic "0". As a result, pass gate transistor 48 will turn on, electrically coupling signal lines 44 and 46.

Alternatively, if signal lines 44 and 46 are not to be electrically coupled upon power-up, RAM cell 30 is constructed such that it will power-up in the "unprogrammed" state. That is, RAM cell 30 is constructed so that upon power-up, the first port 40 will be at a logic "1" while the second port 42 is at a logic "0". this will ensure that pass gate transistor 48 remains off, preventing an electrical coupling of signal lines 44 and 46. RAM cell 30 is so constructed by selectively implanting Boron into the channel region of load transistor 36 during fabrication so that load transistor 36 will have a lower threshold voltage than load transistor 38. This will insure that during the power-up sequence, load transistor 36 will turn on first, forcing the first port 40 to a logic HIGH while the second port 42 is pulled to a logic LOW.

By selectively fabricating the RAM cells of the programmable interconnect matrix 14 in accordance with the above description, FPGA 10 can be constructed such that upon power-up all of the desired interconnections within programmable interconnect matrix 14 are achieved. This eliminates the need for a separate non-volatile storage device and a separate programming operation following power up. If desired, selected portions of a RAM-based FPGA 10 can be constructed to power-up in preferred states so as to perform a specific function in a predictable manner with predictable performance (in terms of routing interconnect timings). Other portions of the RAM-based FPGA can be left as unconfigured for later use by a user. These unconfigured portions would need to be programmed using a configuration program as described above.

So long as RAM cell 30 is fabricated to allow later reprogramming after powering-up in its preferred state, the state of the cell (programmed or not programmed) may be altered at a later time. The criteria for providing sufficient Boron doping to ensure that RAM cell 30 powers-up in a preferred state while still retaining load transistor threshold voltages that allow later reprogramming may be determined empirically by varying the doping levels in accordance with techniques known in the art and testing the RAM cells for writability.

Provided RAM cell 30 can be reprogrammed after power-up, select transistor 50 may be used to access RAM cell 30 to provide a configuration input. Select transistor 50 is activated by a read/write cell select signal on select line 52. When select transistor 52 is activated, a configuration state input is applied to the first node 40. If the configuration input is HIGH, a logic "0" will be written to the RAM cell 30. Conversely, if the configuration input is LOW, a logic "1" will be written to the RAM cell 30. Thus, by providing select transistor 50, means for altering the state of RAM cell 30 after power-up are achieved. Such means may find application, for example, in situations where circuit designers wish to test new logic configurations within FPGA 10.

Figure 3:
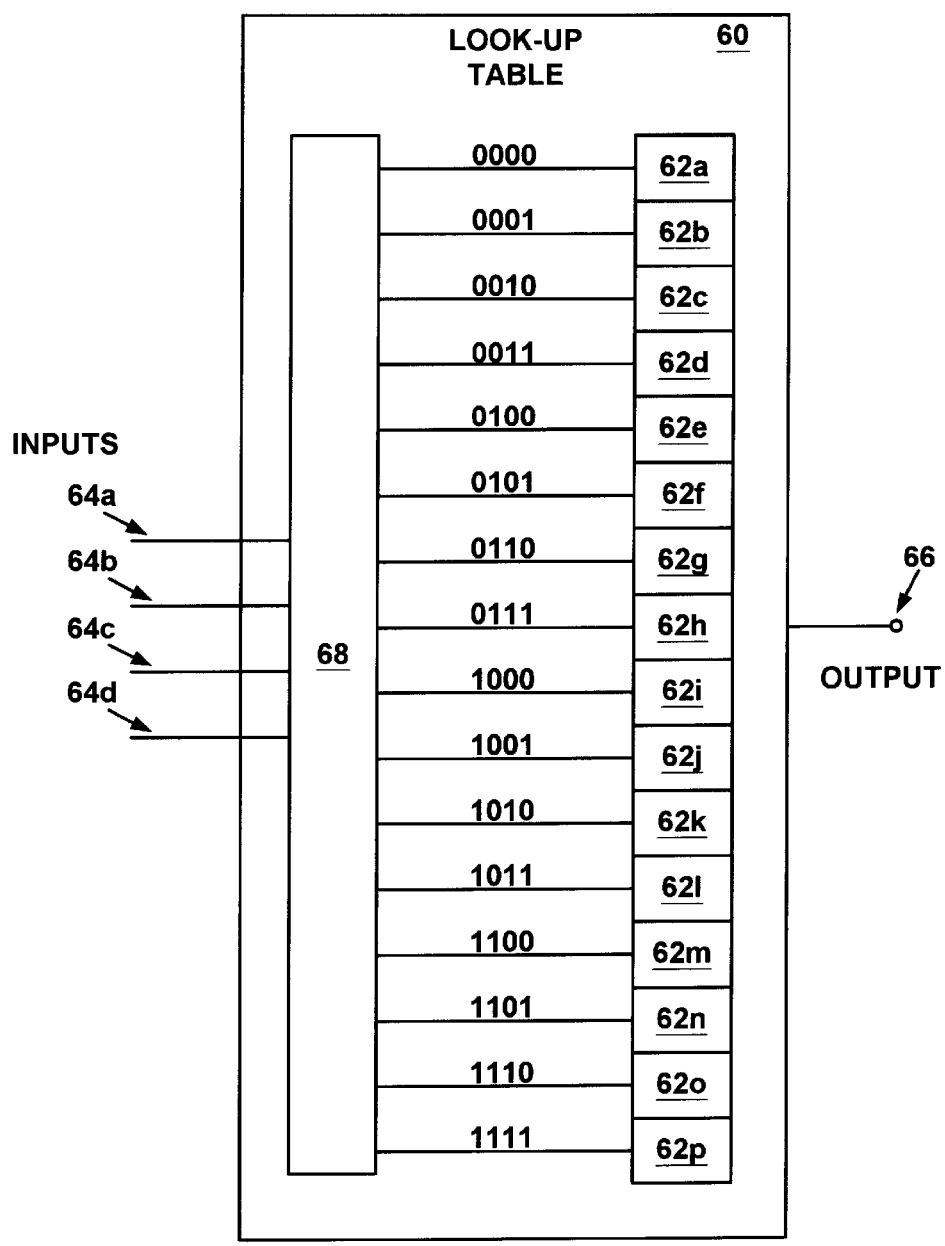
FIG. 3 illustrates look-up table functionality in an FPGA utilizing RAM cells configured to power-up in one or more preferred states in accordance with the present invention.

In addition to finding application as programmable interconnection points within a programmable interconnect matrix, RAM cells may be used to effect logic functions within a RAM-based FPGA. For example, as shown in FIG. 3, RAM cells such as RAM cell 30 may be implemented as a "look-up table" to replace hardware logic gates. To illustrate, suppose look-up table 60 is comprised of RAM cells 62a–62p and decoder 68. Each RAM cell 62a–62p resembles RAM cell 30, that is each RAM cell 62a–62p is configured to power up in a preferred state, "0" or "1". In this example, suppose RAM cells 62a–62o are configured to power-up in a "0" state while RAM cell 62p is configured to power up in a "1" state.

After power-up, if input lines 64a–64d are used to address the look-up table 60, the output signal at output node 66 may reflect a desired logic function, in this case a logical AND operation. To illustrate, suppose all inputs 64a–64d are HIGH. These logic HIGH inputs are decoded by decoder 68 to select an address line corresponding to a logic "1111" pattern. This corresponds to RAM cell 62p of look-up table 60. Because RAM cell 62p powered-up in a "1" state, output node 66 is driven to a logic "1". That is, look-up table 60 has emulated a 4-input AND gate and because all four inputs 64a–64d were HIGH, a logic "1" is presented at output node 66. If any of the inputs 62a–62d are LOW, a RAM cell other than cell 62p will be addressed and, consequently, a logic "0" will be presented at output node 66. Other logic functions can be implemented using appropriate look-up tables where each table element is a RAM cell configured to power-up in a preferred state.

Figure 4:
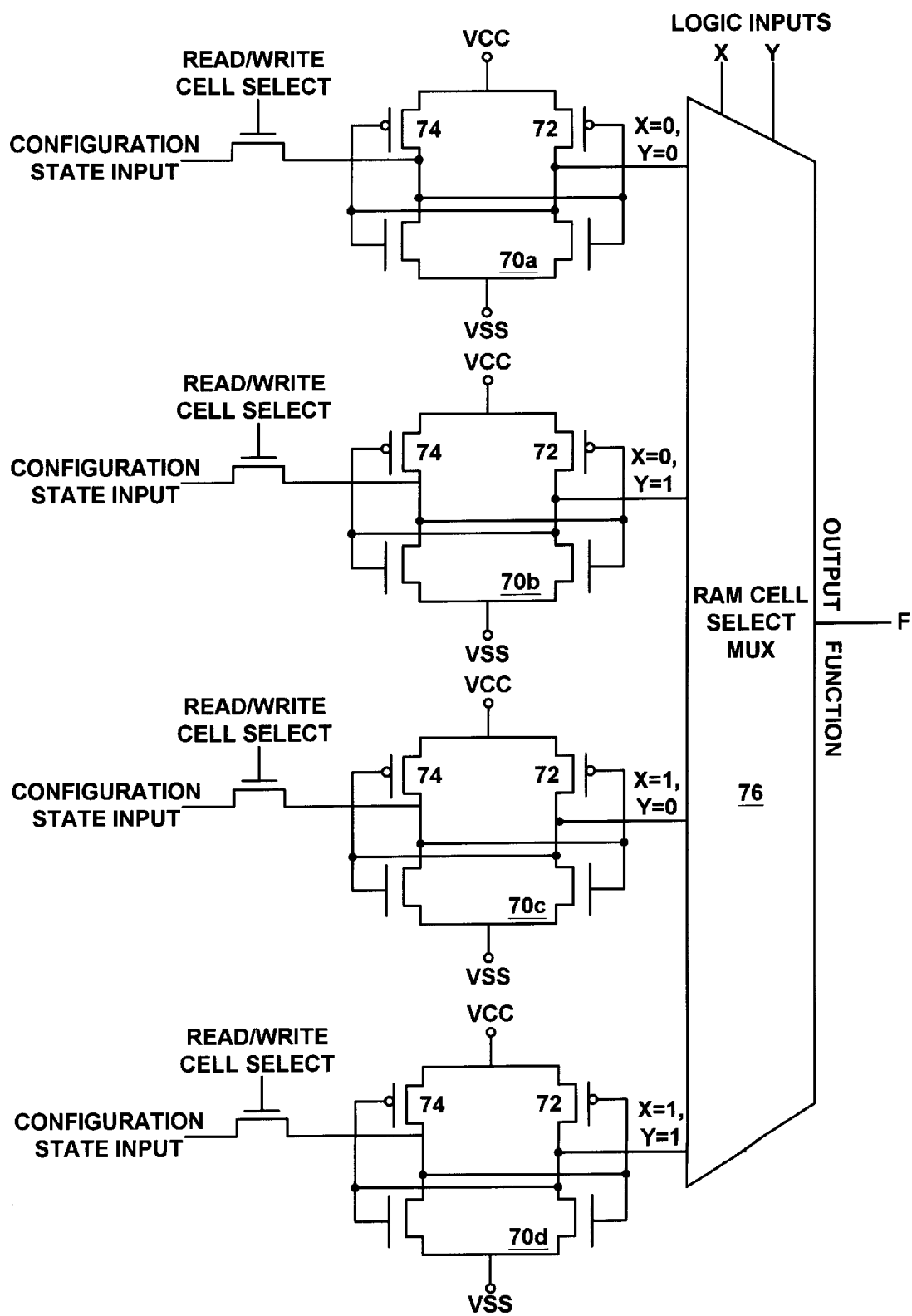
FIG. 4 illustrates one implementation of a two input look-up table for use in an FPGA and having RAM cells configured to power-up in one or more preferred states in accordance with the present invention.

The look-up table application can be used to implement a variety of logic functions. FIG. 4 further illustrates the case of a two input look-up table. The look-up table is formed using a two input multiplexer 76 and four RAM cells 70a–70d. The RAM cells are each coupled to data path inputs of mux 76. The implementation shown in FIG. 4 effectively removes the individual RAM cells 70a–70d from the read path (e.g., in contrast to schemes such as that illustrated in FIG. 3 in which an input address is decoded prior to presentation to the RAM cells which must then be accessed). Thus, overall throughput speed is enhanced over those look-up table implementation which position RAM cells in the read path. Nevertheless, implementations which do provide RAM cells in the read path may be utilized as alternatives to the scheme shown in FIG. 4.

Any function "F" of the two logic inputs "X" and "Y" can be implemented by selectively programming the appropriate states in the four cells of the look-up table. To set a predetermined logic function on power-up, the appropriate load transistor would be selectively implanted in each RAM cell 70a–70d of the look-up table. For example, to set the look-up table to implement X OR $\overline{Y}$ on power-up, transistor 72 would be implanted in RAM cells 70a, 70c and 70d while transistor 74 would be selectively implanted in RAM cell 70b. Other logic functions which could be implemented are set forth below in Table 1 which indicates the required storage patterns for achieving various logic function outputs. It should be appreciated that for each added logic input, the number of required RAM cells 70 and the required width of the multiplexer 76 doubles. Nevertheless, by selectively implanting both interconnect RAM cells and look-up table RAM cells in the logic cells of RAM-based FPGA 10, any portion of the FPGA 10 could be preprogrammed to always power-up in an appropriate state to implement any desired logic macrofunction.

TABLE 1

| Logic Function "F" | Cell 70a Storage | Cell 70b Storage | Cell 70c Storage | Cell 70d Storage |
|---|---|---|---|---|
| $\overline{X}$ AND $\overline{Y}$ | 1 | 0 | 0 | 0 |
| X AND $\overline{Y}$ | 0 | 0 | 1 | 0 |
| $\overline{X}$ AND Y | 0 | 1 | 0 | 0 |
| X AND Y | 0 | 0 | 0 | 1 |
| $\overline{X}$ OR $\overline{Y}$ | 1 | 1 | 1 | 0 |
| X OR $\overline{Y}$ | 1 | 0 | 1 | 1 |
| $\overline{X}$ OR Y | 1 | 1 | 0 | 1 |
| X OR Y | 0 | 1 | 1 | 1 |
| $\overline{X}$ EXOR $\overline{Y}$ | 0 | 1 | 1 | 0 |
| X EXOR $\overline{Y}$ | 1 | 0 | 0 | 1 |
| $\overline{X}$ EXOR Y | 1 | 0 | 0 | 1 |
| X EXOR Y | 0 | 1 | 1 | 0 |

Figure 5:
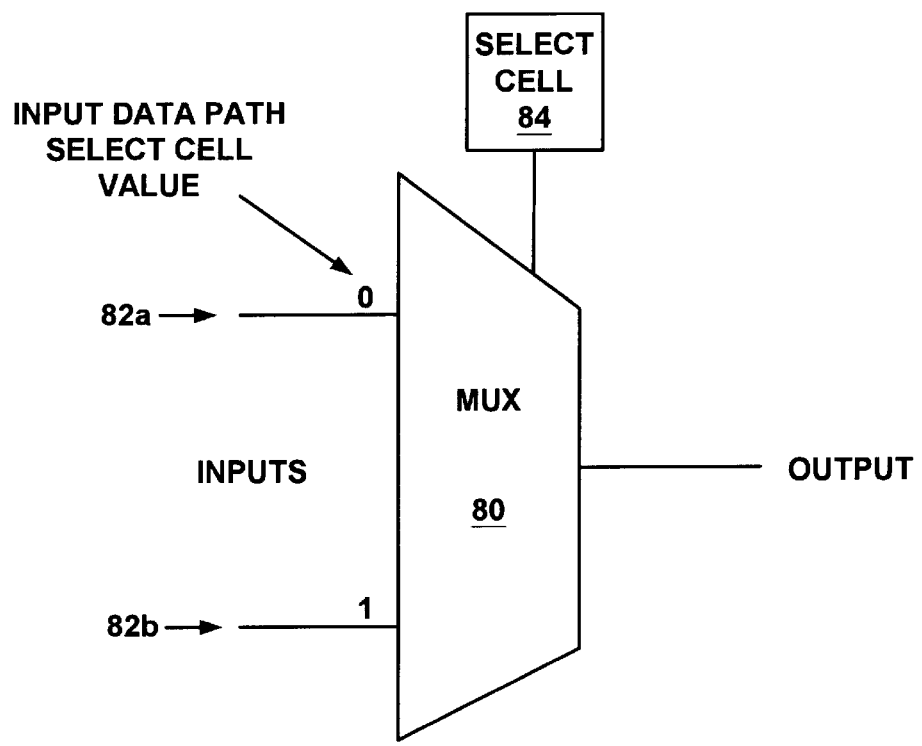
FIG. 5 illustrates a RAM cell used as a select cell for a multiplexer according to the present invention.

RAM cells such as RAM cell 30 also find application as select cells for multiplexers within FPGA 10. This is illustrated in FIG. 5. Multiplexer 80 receives two input lines 82a and 82b. Multiplexer 80 can be configured to power-up so that a preferred input is selected by using select cell 84. Select cell 84 is a RAM cell configured to power up in a preferred state as described above. If select cell 84 is configured to power up in a logic "0" state, multiplexer 80 will select input 82a. Conversely, if select cell 84 is configured to power up in a logic "1" state, multiplexer 80 will select input 82b. in this way, multiplexer 70 can be configured to select an appropriate input upon power-up.

The techniques described above can be used to predetermine the logic configuration of any portion of a RAM-based FPGA to perform a specific function in a predictable manner with predictable performance while leaving a portion of the device as RAM-based reconfigurable logic which can be modified at will. This capability allows implementation of pre-designed, pretested macrofunctions with guaranteed performance within RAM-based FPGAs without the need for additional user intervention. Because only a single additional mask and a single additional implant step is all that is required during fabrication of the FPGA to implement the predetermined self-initializing logic function, a wide range of such "hard wired" macrofunctions are capable of being implemented in the same RAM-based FPGA.

A further advantage provided by the present invention is that development and characterization of such macrofunctions can be done in the programmable device with the assurance that when the self-initializing version is fabricated it will have the same performance as a volatile RAM implemented macro that may have been utilized for initial testing. Because the logic in the predetermined self-initializing device is implemented in the same RAM cells in the same location as the RAM cells in the volatile version of the device, the performance achieved in the volatile device will be duplicated in the predetermined configuration version of the device. This means that designers, who would otherwise have to account for timing mismatches which might result when a volatile FPGA macrofunction is transferred to an ASIC implementation, no longer need to be concerned with such difficulties. The preprogrammed FPGA using RAM cells such as RAM cell 30 described above assures that the same timing characteristics as were present in the nonvolatile device will be achieved in the preprogrammed version.

Thus, means for implementing embedded macrofunctions in portions of a RAM-based FPGA (or in the entire FPGA) have been described. Use of these means allows the logic so implemented to be available immediately upon power-up such that it can be used in the booting logic of a larger system. This contrasts with the case for a system employing other RAM-based FPGAs having RAM cells which must first be programmed to configure the logic after system power-up. Unlike such systems, the present invention eliminates the need for external EPROM, EEPROM or other nonvolatile storage media to be provided to store a configuration program for the FPGA. Although discussed with reference to specific illustrated embodiments, it should be appreciated that the present invention is applicable to wide numbers of programmable devices, including PLDs, CPLDs, FPGAs, and ASICs. Accordingly, the above discussed embodiments and accompanying diagrams should be regarded as illustrative only and the present invention should in no way be limited thereby.

What is claimed is:

1. A programmable logic device, comprising:
   a node; and
   a look-up table having a random access memory (RAM) cell configured to power-up in a preferred state so as to provide a predetermined logic signal representing a logic function to said node upon power-up.

2. A programmable logic device as in claim 1 wherein said node comprises an interconnection element having two signal lines associated therewith such that when said interconnection element is in a first state said signal lines are electrically coupled and when said interconnection element is in a second state said signal lines are not electrically coupled, said predetermined logic signal for selecting one of said first and second states.

3. A programmable logic device as in claim 2 wherein said interconnection element is a transistor.

4. A programmable logic device as in claim 3 wherein said signal lines comprise a programmable interconnect matrix.

5. A programmable logic device as in claim 1 wherein said RAM cell comprises a first PMOS transistor having an associated first threshold voltage and a second PMOS transistor having an associated second threshold voltage lower than said first threshold voltage.

6. A programmable logic device as in claim 5 further comprising a multiplexer, said RAM cell being coupled to a data path input of said multiplexer through said node.

7. A programmable logic device as in claim 5 wherein said first and second PMOS transistors are load transistors of said RAM cell.

8. A programmable logic device as in claim 5 further comprising a multiplexer, wherein said RAM cell is coupled to said mulitplexer through said node and is configured to select a data path input of said multiplexer.

9. A programmable logic device as in claim 1, further comprising other RAM cells configured to power up according to cell symmetry and voltage transients.

10. A programmable logic device as in claim 9 wherein said RAM cell configured to power up in a preferred state includes selectively dopped load devices.

11. A method of powering-up a programmable logic device in a configuration state, comprising the steps of:
applying power to a random access memory (RAM) cell within said programmable logic device;
generating an output signal at an output of said RAM cell, said output signal having a predetermined logic state according to a preferred doping of load devices within said RAM cell, said preferred doping being accomplished during manufacture of said RAM cell to allow said RAM cell to power up in a preferred state corresponding to said predetermined logic state; and
implementing a logic function within said programmable device in accordance with said output signal.

12. A method of powering-up a programmable logic device as in claim 11 wherein said logic function is implemented using look-up table logic which includes said RAM cell.

13. A method of programming a programmable logic device, comprising the steps of:
applying power to said programmable logic device;
powering up a random access memory (RAM) cell within said programmable logic device in a preferred state so as to provide a predetermined logic signal upon said step of applying power; and
selecting a data path input at a multiplexer within said programmable logic device according to said logic signal.

14. A programmable logic device, comprising:
a random access memory (RAM) cell configured to power-up in a preferred state so as to provide a predetermined logic signal upon power-up, said RAM cell comprising a first PMOS transistor having an associated first threshold voltage and a second PMOS transistor having an associated second threshold voltage lower than said first threshold voltage; and
an interconnection element coupled to said RAM cell having two signal lines associated therewith such that when said interconnection element is in a first state said signal lines are electrically coupled and when said interconnection element is in a second state said signal lines are not electrically coupled, said predetermined logic signal for selecting one of said first and second states.

15. A method of programming a programmable logic device, comprising the steps of:
applying power to said programmable logic device; and
powering up a random access memory (RAM) cell within said programmable logic device in a preferred state so as to provide a predetermined logic signal to program an interconnection of signal lines within said programmable logic device.

* * * * *